U S008560283B2

(12) United States Patent
Cheng et al.

(10) Patent No.: US 8,560,283 B2
(45) Date of Patent: Oct. 15, 2013

(54) METHODS AND APPARATUS TO COMPENSATE FIRST PRINCIPLE-BASED SIMULATION MODELS

(75) Inventors: Xu Cheng, Pittsburgh, PA (US); Richard Williams Kephart, Kittanning, PA (US); Charles Menten, Gibsonia, PA (US)

(73) Assignee: Emerson Process Management Power and Water Solutions, Inc., Pittsburgh, PA (US)

( * ) Notice: Subject to any disclaimer, the term of this patent is extended or adjusted under 35 U.S.C. 154(b) by 1022 days.

(21) Appl. No.: 12/501,262

(22) Filed: Jul. 10, 2009

(65) Prior Publication Data

US 2011/0010138 A1    Jan. 13, 2011

(51) Int. Cl.
*G06G 7/48* (2006.01)
*G06F 17/50* (2006.01)

(52) U.S. Cl.
CPC ................................ *G06F 17/5009* (2013.01)
USPC .................................... 703/6; 700/29; 700/30

(58) Field of Classification Search
USPC ...................................... 703/2, 6; 700/29–31
See application file for complete search history.

(56) References Cited

U.S. PATENT DOCUMENTS

| 5,877,954 | A | * | 3/1999 | Klimasauskas et al. | 700/29 |
| 6,047,221 | A | * | 4/2000 | Piche et al. | 700/44 |
| 6,181,975 | B1 | | 1/2001 | Gross et al. | |
| 6,434,435 | B1 | | 8/2002 | Tubel et al. | |
| 6,941,287 | B1 | | 9/2005 | Vaidyanathan et al. | |
| 7,213,006 | B2 | * | 5/2007 | Hartman et al. | 706/16 |
| 7,451,122 | B2 | | 11/2008 | Dietrich et al. | |
| 8,019,701 | B2 | * | 9/2011 | Sayyar-Rodsari et al. | 706/12 |
| 2005/0071035 | A1 | | 3/2005 | Strang | |
| 2007/0174808 | A1 | | 7/2007 | Beale | |
| 2007/0192063 | A1 | | 8/2007 | Abu-El-Zeet et al. | |

FOREIGN PATENT DOCUMENTS

GB    2464181    4/2010

OTHER PUBLICATIONS

Search Report, issued by the UK Patent Office on Oct. 27, 2010 in connection with Great Britain Application No. GB1011185.4 (4 pages).

Ljung, Lennart, "System Identification Theory for the User: Second Edition," PTR Prentice Hall Information and System Sciences Series, Linkoping University, Sweden, 1999, cover, table of contents, pp. 203-205 and pp. 543-547; 17 pages total.

* cited by examiner

*Primary Examiner* — Eunhee Kim
(74) *Attorney, Agent, or Firm* — Hanley, Flight & Zimmerman, LLC

(57) ABSTRACT

Methods and apparatus to compensate first principle-based simulation models are disclosed. An example method to compensate a first-principle based simulation model includes applying one or more first test inputs to a process system to generate first output data, applying one or more second test inputs to a first principle model to generate second output data, generating an error model based on the first and second output data, applying input data to the first principle model to generate simulation model output data, and compensating the model data via the error model to generate compensated model output data.

29 Claims, 7 Drawing Sheets

METHODS AND APPARATUS TO COMPENSATE FIRST PRINCIPLE-BASED SIMULATION MODELS

FIELD OF THE DISCLOSURE

This disclosure relates generally to process modeling and, more particularly, to methods and apparatus to compensate first principle-based simulation models.

BACKGROUND

In the field of process simulation, simulator design is typically based on two different model types: first principle-based and empirical data-based models. A first principle-based model, also called a high-fidelity model, models equipment and processes based on first principle physical laws, such as mass, energy, and momentum conservation laws. First principle-based models describing a physical process are often complex and may be expressed using partial differential equations and/or differential algebraic equations. These equations may describe process or equipment properties and/or changes in those properties. In many first principle-based models, equations are modular to model specific pieces of equipment and/or processes in a multi-equipment or multi-process system. Thus, equipment and/or processes can be easily changed and/or updated in the model by replacing equations in the model with equations corresponding to the changed and/or updated equipment and/or processes. However, first principle-based models are subject to modeling errors due to the inability of first principle-based models to account for uncertainty surrounding the actual characteristics or properties of process equipment.

On the other hand, empirical data-based models, also commonly called black-box models, generate modeling formulas or equations by applying test inputs to an actual process system in accordance with a designed experiment and measuring test outputs corresponding to the test inputs. Based on the inputs and outputs, equations to determine a relationship between the inputs and outputs are generated to model the process or equipment. In this approach, the empirical equations may be easier to obtain than first principle-based equations, and dynamic transient phenomena may be better captured and represented in the empirical equations than first principle-based equations. However, special experiments must be designed, implemented, and executed to acquire accurate and diverse data sufficient to acquire the empirical data used to develop the model. Further, when equipment is changed or replaced, new empirical models must be developed, which is time consuming and costly.

Regardless of the type of process modeling approach used, a process system model often needs tuning and/or adjustment. Such tuning and adjustment are typically performed by a trial and error method that may be repeated multiples times to reflect drift in process data due to equipment aging or fatigue.

SUMMARY

Methods and apparatus to compensate first principle-based simulation models are described herein. Some example methods to compensate a first-principle based simulation model include applying one or more first test inputs to a process system to generate first output data, applying one or more second test inputs to a first principle model to generate second output data, and generating an error model based on the first and second output data. The example methods further include applying input data to the first principle model to generate simulation model output data and compensating the model data via the error model to generate compensated model output data.

Example apparatus to compensate first principle-based models are also described. Some example compensated first principle-based models include a first principle model implemented in a memory to generate first output data based on one or more inputs, an error model implemented in a memory to compensate the first output data during an operational phase to generate a compensated first principle-based model output based on the first output data, and an error model generator to generate the error model based on the first output data and process data during a training phase. Generating the error model includes receiving the first output data and second output data from a process system based on the one or more inputs and generating the error model based on the first and second output data.

Additionally, some example computer-readable media are described. The example computer-readable media include instructions, which, when executed by a computer, cause the computer to apply one or more first test inputs to a process system to generate first output data, apply one or more second test inputs to a first principle model to generate second output data, generate an error model based on the first and second output data, apply input data to the first principle model to generate simulation model output data, and compensate the model data via the error model to generate compensated model output data.

Some example methods to generate a dynamic error model to compensate a first principle-based model are described. The example methods include determining a first prediction equation to express a relationship between one or more process system inputs and one or more process system outputs, determining an initial condition of the first prediction equation for one or more model parameters based on one or more test inputs and one or more test outputs, determining a second prediction equation at a first time based on at least one of a third prediction equation at a second time prior to the first time or the initial condition, determining an optimization function to optimize a difference in outputs between a first principle-based model and the process system in response to one or more substantially equivalent inputs, solving the optimization function within the constraints to determine the model parameters based on at least one of the second prediction equation or the third prediction equation, and generating a dynamic error model based on the model parameters.

Some further example methods to generate a dynamic error model to compensate a first principle-based model include applying test input data to a process to generate test output data, generating a steady-state solution based on the test input and output data, and generating one or more prediction equations based on the steady-state solution. A prediction equation at a first time is based on at least one of: test output data at one or more previous times; test input data at one or more previous times; or one or more prediction equations at previous times. The example methods further include applying one or more constraints to an optimization function, and solving the optimization function to optimize the one or more prediction equations within the one or more constraints to generate dynamic error model.

DETAILED DESCRIPTION

Although the following discloses example systems including, among other components, software and/or firmware executed on hardware, it should be noted that such systems are merely illustrative and should not be considered as limiting. For example, it is contemplated that any or all of these hardware, software, and firmware components could be embodied exclusively in hardware, exclusively in software, or in any combination of hardware and software. Accordingly, while the following describes example systems, persons of ordinary skill in the art will readily appreciate that the examples provided are not the only way to implement such systems.

In the process control (e.g., industrial process control) field, equipment and/or processes are rarely true black boxes. On the contrary, some amount of information is usually known about the equipment and/or processes because such equipment and processes are often accompanied by well-documented design data and/or operational history data. In accordance with the examples described in greater detail below, useful information derived from such documentation may be used to define a first principle model. The first principle model may then be used to model the dominant process gain(s) and nonlinearit(ies) of a process system. An error model may then be developed to trim and/or compensate for error(s) in the first principle model. In many applications, major relationships between dominant process input and output variables are known and well modeled using the first principle model. However, uncertainties in a process may cause sufficient variances in the process output to justify developing an error model to correct for the variances.

The example methods, apparatus, and articles of manufacture described herein may be used to compensate first principle-based process simulation models. More specifically, given a set of input data and output data for a process, the example methods, apparatus, and articles of manufacture described herein may be used to determine an error model to compensate for the difference between the process system output data and first principle-based model output data for a given input or set of inputs. After determining an error model, further simulations may be performed using the first principle-based model, which is compensated by the error model. As a result, the accuracy and flexibility of the first principle-based model may be utilized while process variations are accounted for (i.e., compensated) by the error model.

Figure 1:
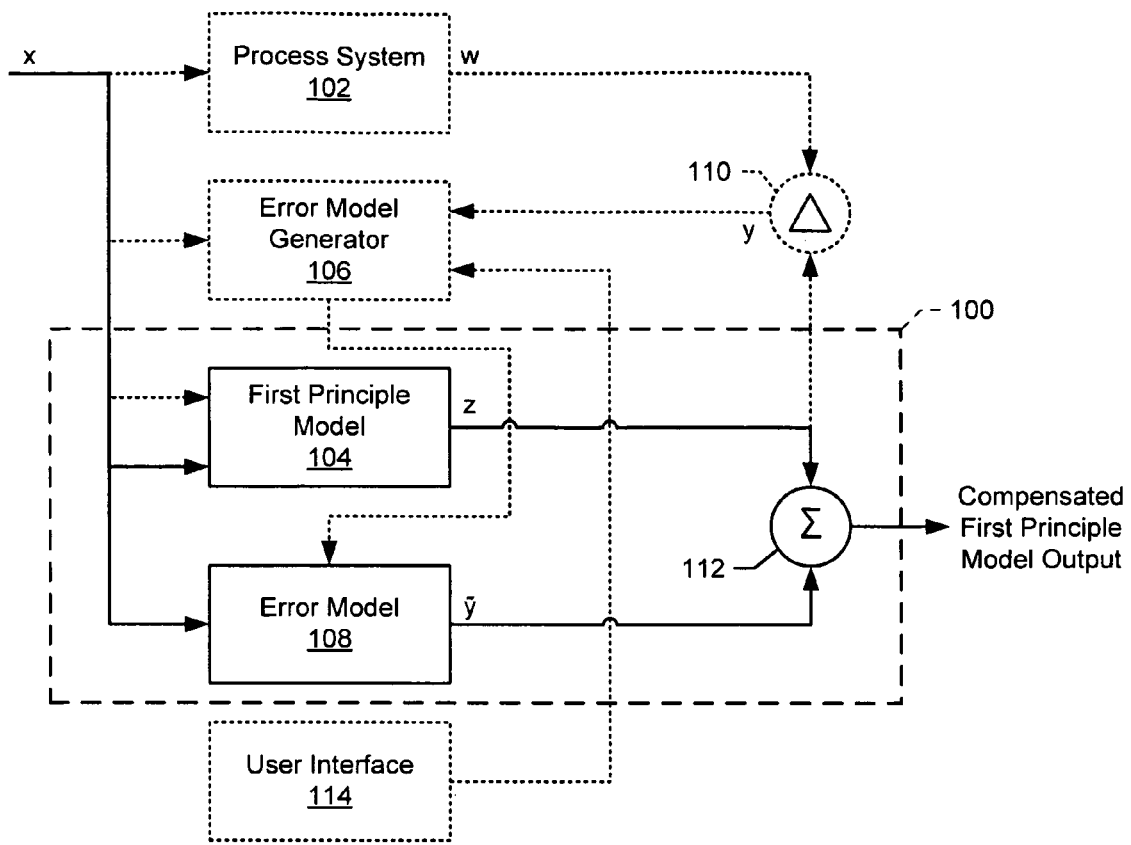
FIG. 1 is a block diagram of an example compensated first principle-based simulation model in a parallel configuration.

FIG. 1 is a block diagram of an example compensated first principle-based simulation model 100 in a parallel configuration. The example compensated first principle-based simulation model 100, which may also be called an additive model, may be used to model, for example, an industrial process and/or industrial equipment. For example, the simulation model 100 may generate one or more outputs in response to one or more inputs to accurately model the effects of changing the input(s), changing the process, and/or changing one or more pieces of equipment. In this example, the compensated first principle-based simulation model 100 receives one or more outputs w from a process system 102, such as an industrial process, which receives one or more input(s) x.

As depicted in FIG. 1, the compensated first principle-based simulation model 100 includes a first principle model 104. In general, the example first principle model 104 is a mathematical model that simulates receiving the same or substantially the same input(s) as the process system 102, simulates the process system 102 using or responding to the input(s), and generates substantially the same output(s) z as the process system 102 except for some modeling error. As described below, because the process system 102 is a physical process and the first principle model 104 is a mathematical model of the physical process, the process system 102 and the first principle model 104 generally do not receive exactly the same input(s) or produce the same output(s) given the same input(s).

As referred to herein, receiving the same input(s) may refer to either qualitatively and quantitatively receiving the same input(s), or receiving quantitative representations of input(s) in appropriate representative form(s). For example, a process system of a coal-fired power plant and a first principle model of the coal-fired power plant may receive the same or substantially the same input(s) by receiving 1,000 kilograms (kg) of coal and a mathematical representation of 1,000 kg of coal, respectively. Similarly, as referred to herein, having the same output(s) may refer to either qualitatively and quantitatively having the same output(s), or outputting quantitative representations of output(s) in appropriate representative form(s). For example, the coal-fired power plant may output 302.78 kilowatt-hours (kWh) of electricity, while a first principle model of the coal-fired power plant may output a mathematical representation of 302.78 kWh.

To reduce modeling error in the output of the first principle model 104, an error model generator 106 is provided. The error model generator 106 receives the same or substantially the same input(s) (and/or mathematical representations of the same input(s)) as the process system 102 and/or the first principle model 104. The error model generator 106 also receives a difference between the outputs from the process system 102 and the first principle model 104 corresponding to the inputs. Based on the input(s) and the output difference(s), the error model generator 106 generates an error model 108. The example error model 108 receives the same or substantially the same inputs as the first principle model 104 and generates one or more outputs $\tilde{y}$ to compensate for error between the first principle model 104 and the process system 102. In general, the error model 108 may include a steady-state error model and/or a dynamic error model as described in more detail in connection with FIG. 4 below.

A subtractor 110 generates the difference y between the process system 102 outputs and the first principle model 104 outputs. The subtractor 110 then sends the difference(s) y to the error model generator 106. A summer 112 receives outputs from the first principle model 104 (z) and from the error model 108 ($\tilde{y}$) and sums the outputs to generate a compensated first principle model output.

The example compensated first principle-based simulation model 100 may receive one or more of constraints, input data, error model functions, and/or other data for modeling from a user interface 114. As explained in further detail below, the constraints, data, and/or error model functions may be used by the error model generator 106 to generate the error model 108 in an accurate manner.

Figure 2:
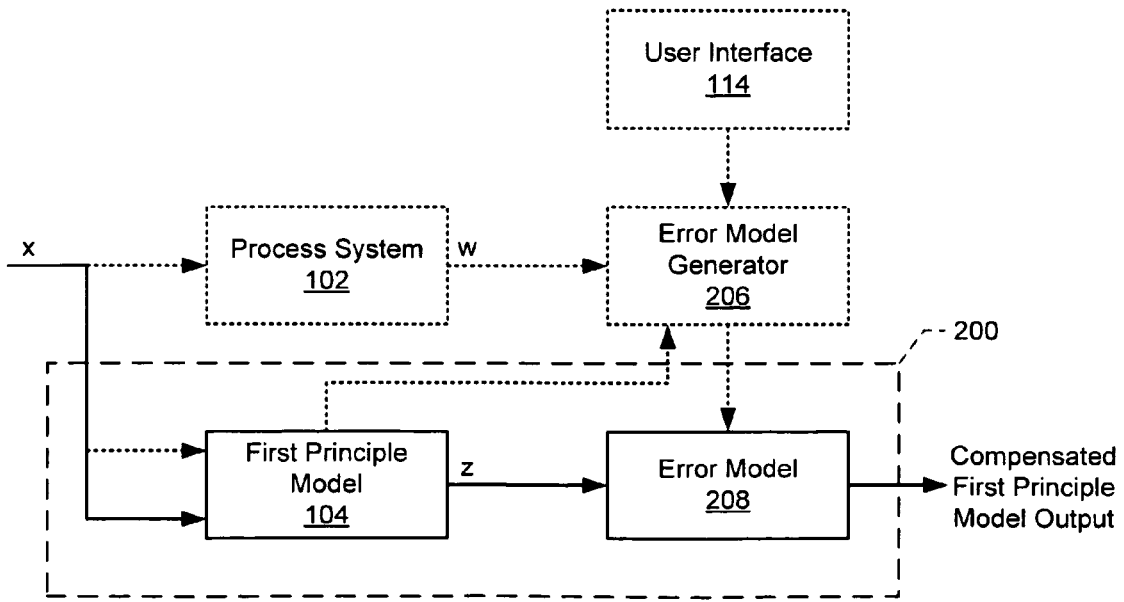
FIG. 2 is a block diagram of an example compensated first principle-based simulation model in a cascade configuration.

The example compensated first principle-based simulation model 100 operates in two phases: a training phase and an operational phase. In FIGS. 1 and 2, objects and data used during the training phase are illustrated using dashed lines, while objects and data used during the operational phase are illustrated using solid lines. During the training phase, the example process system 102, the example first principle model 104, and the example error model generator 106 receive the same or substantially the same test inputs. The subtractor 110 receives output(s) w and z from the process system 102 and the first principle model 104 and sends the difference(s) to the error model generator 106. The error model generator 106, based on the input(s) and the difference(s), generates the error model 108. As described in more detail below, the error model 108 may include a steady-state error model and/or a dynamic error model.

During the operational phase, the first principle model 104 and the error model 108 receive the same or substantially the same input(s) and/or mathematical representations of the same input(s). In response to the input(s), the first principle model 104 generates simulation model output data, and the error model 108 generates error model output data. The summer 112 receives the simulation model output data z from the first principle model 104 and the error model output data ỹ from the error model 108, sums the data, and outputs a compensated first principle model output. In general, a compensated first principle model output that is closer to a process system output for the same input is more desirable. The detailed training and operation of the example compensated first principle-based simulation model 100 is described below with reference to the example process 500 of FIG. 5.

FIG. 2 is a block diagram of an example compensated first principle-based simulation model 200 in a cascade configuration. Like the simulation model 100 of FIG. 1, the example first principle-based simulation model 200 may be used to model an industrial process and/or industrial equipment to determine one or more outputs based on one or more inputs. The example first principle-based simulation model 200, which may also be called a multiplicative model, receives output(s) w from the process system 102 and includes a first principle model 104, an error model generator 206, and an error model 208. The example error model generator 206 and/or the error model 208 may be similar or identical to respective ones of the error model generator 106 and/or the error model 108 described in connection with FIG. 1.

Like the compensated first principle-based simulation model 100 of FIG. 1, the example compensated first principle-based simulation model 200 of FIG. 2 operates in a training phase and an operational phase. During the training phase, the example process system 102, and the example first principle model 104 receive the same or substantially the same test input(s) x. Based on the test input(s), the process system 102 generates test process output data and the first principle model 104 generates test model output data. The test process output data and the test model output data are received by the error model generator 206. While the error model generator 206 uses empirically-generated data such as would be generated to build an empirical model of the process system 102, the error model generator 206 may use relatively less empirical data to build the error model 208. As a result, the cost and time needed to generate an empirical model may be reduced, and a simplified, abbreviated version of the experiments may be performed on the process system 102 to generate the test process output data. Less empirical data may be used because the error model 208 trims for modeling errors due to, for example, a few variables that most affect the process system 102 output that are not modeled by the first principle-model 104. More empirical data may be used, but may result in undesired transient data and/or noise affecting the error model 208 and/or the compensated first principle model output.

The error model generator 206 generates the error model 208 based on the test process output data w and test model output data z to compensate the first principle model 104. Example methods of generating the error model 208 are described below. The example compensated first principle-based simulation model 200 communicates with the user interface 114 to receive one or more of constraints, data, error model functions, and/or other data for modeling. As explained in further detail below, the constraints, data, and/or error model functions may be used by the error model generator 206 to generate an accurate error model 208.

After generating the error model 208, the example first principle-based simulation model 200 enters the operational phase. During the operational phase, the first principle model 104 receives one or more inputs x representative of inputs to the process system 102. Based on the input(s) x, the first principle model 104 generates outputs z (e.g., to model the output(s) w of the process system 102 in response to corresponding input(s) x), which are received by the error model 208 as inputs. The error model 208 compensates the model outputs z generated by the first principle model 104 and outputs a compensated first principle model output. In contrast to the example parallel configuration shown in FIG. 1, the error model 208 of FIG. 2 compensates the first principle model 104 output without receiving the corresponding input(s) x. Thus, the cascade configuration of FIG. 2 is better suited to first principle models (and, by extension, process systems) having linear transfer functions. The detailed operation of the example compensated first principle-based simulation model 200 is described below with reference to the example process 600 of FIG. 6.

Any or all of the example first principle model 104, the example error model generators 106 and/or 206, and/or the example error models 108 and/or 208 may be implemented using any combination of hardware, firmware, and/or software. However, any of the first principle model 104, example error model generators 106 and 206, and the example error models 108 and 208 that are implemented in firmware and/or software may be implemented or embodied on a computer-readable medium including, but not limited to, dynamic (e.g., dynamic random access) and/or static (e.g., static random access) memory, solid state memory and/or storage (e.g., solid state hard drives, flash memory), optical storage (e.g., CDs, DVDs), and/or magnetic storage (e.g., tapes, floppy diskettes). The firmware or software implemented or embodied on such computer-readable media may include instructions for execution on a processing device such as a processor 912 (FIG. 9) and/or may be implemented on an application-specific integrated circuit (ASIC).

Figure 3:
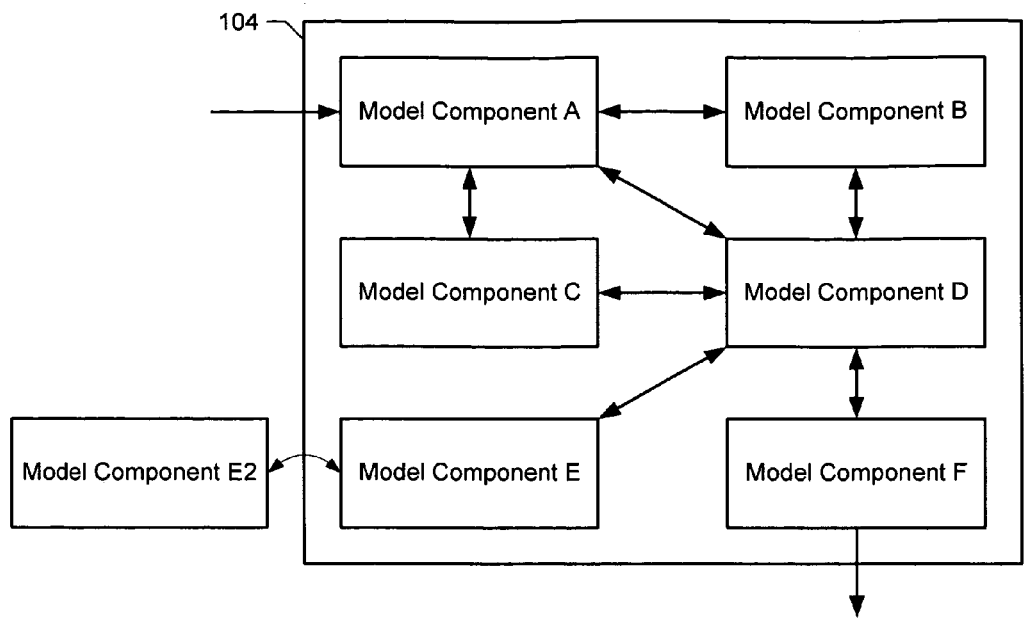
FIG. 3 is a more detailed block diagram of the example first principle model illustrated in FIGS. 1 and 2.

FIG. 3 is a more detailed block diagram of the example first principle model 104 shown in FIGS. 1 and 2. The example first principle model 104 includes model components A-F. Advantages of modeling industrial processes and/or equipment using a first principle-based model include the ability to easily change the model to accommodate new or replacement parts and/or processes. The model component A may be individually modeled using mathematical algorithms to receive one or more inputs and/or generate one or more outputs. The input(s) to the model component A may be received from any other ones of the model components B-F and/or from an external stimulus (e.g., input(s) x to the first principle model 104). The external stimulus may be, for example, test input data for use during the training phase and/or input data for use during the operational phase as described in connection with FIGS. 1 and 2.

In the illustrated example, the model component A receives one or more inputs from an external stimulus and from the model components B, C and D. Additionally, the model component A provides outputs to model components B, C and D. Similarly, the example model component F receives input(s) from the model component D and generates one or more outputs to output to the model component D and/or to output from the first principle model 104. The output(s) z from the first principle model 104 (e.g., from model component F) may be test model outputs for use during the training phase and/or model outputs generated during the operational phase as described in connection with FIGS. 1 and 2.

In a case where the example first principle model 104 is used in connection with a simulation model for a coal-fired power plant, the model component A corresponds to or models the heat generation component of the power plant, which receives a volume of coal (i.e., the input to the first principle model 104) and generates outputs (e.g., heat) that are received as inputs to other model components. Further, the model component B may model the water circulation system, the model component C may model the steam system, and the model component D may model the turbine system. Still further, the example model component E may model a cooling system, and the model component F may model the electrical generator powered by the turbine, which generates an output (e.g., electrical power) from the first principle model 104. The illustrated input and output interrelationships between the model components depicted in FIG. 3 are merely examples and any other interrelationships may be used to suit a particular application.

As mentioned above, the advantages of a first principle-based model include the ability to easily add or change model components. In the example of FIG. 3, the model component E may be removed from the first principle model 104 and replaced by a new model component E2. Such a replacement may occur when, for example, an old or worn part on a piece of industrial equipment is replaced by a new or improved piece of equipment. An example process model component (e.g., E) may be replaced by a more efficient process model component (e.g., E2) that generates the same output(s) as the replaced process. After replacing the model component E with the new model component E2, the example new model component E2 operates using the same type(s) and number of input(s) and generates the same type(s) and number of output(s). Alternatively, the new model component E2 may generate the same output with fewer inputs, or generate fewer outputs (e.g., byproducts) using the same or fewer inputs.

Figure 4:
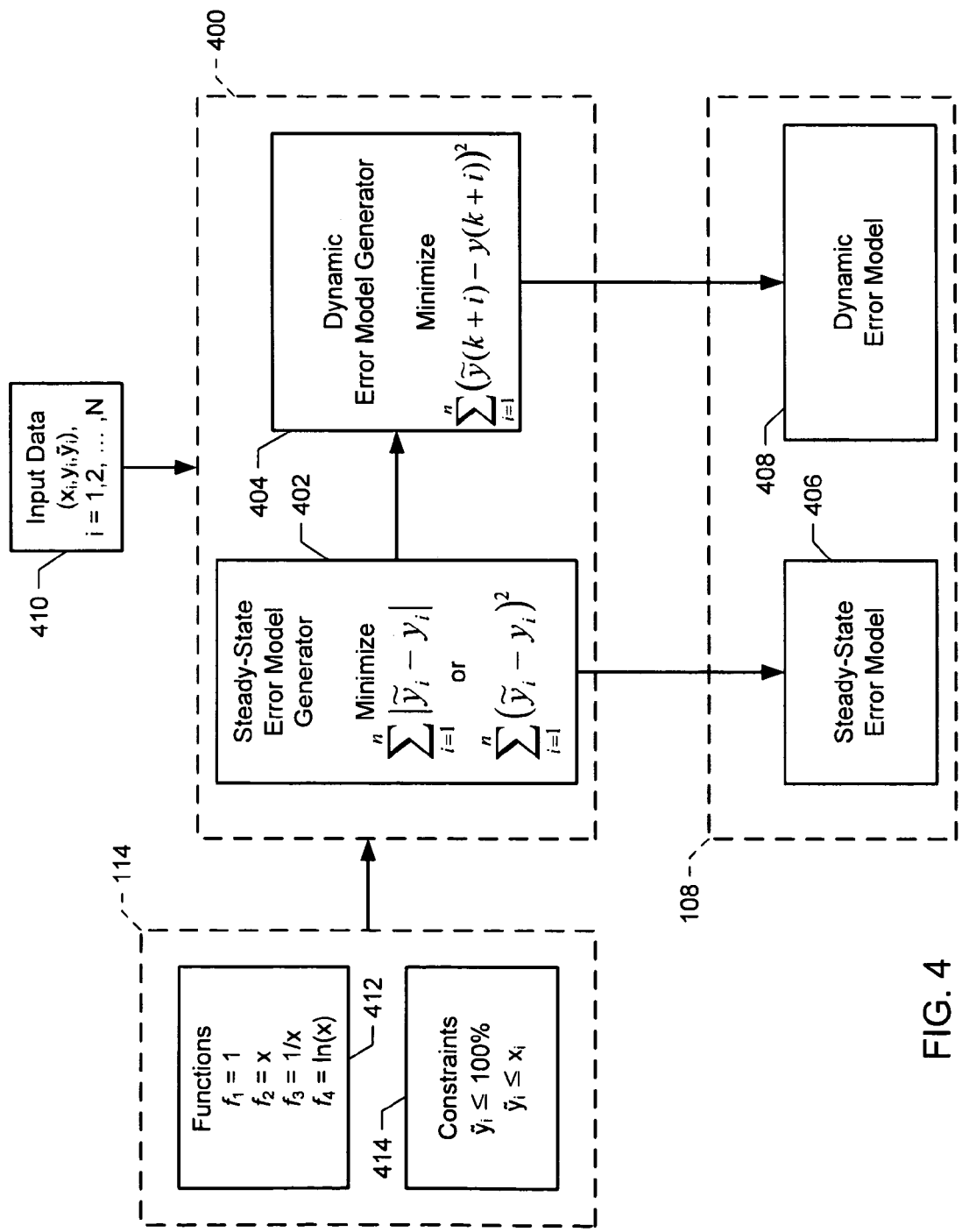
FIG. 4 is a block diagram of an example error model generator to implement the error model generator of FIGS. 1 and 2 during a training phase.

FIG. 4 is a block diagram of an example error model generator 400 that may be used to implement the error model generators 106 or 206 of respective FIGS. 1 and 2 during a training phase. The example error model generator 400 generates the error model (e.g., 108 of FIG. 1 or 208 of FIG. 2) that may be used to compensate a first principle-based simulation model output. The example error model generator 400 includes a steady-state error model generator 402 and a dynamic error model generator 404. The example steady-state error model generator 402 generates a steady-state error model 406, and the example dynamic error model generator 404 generates a dynamic error model 408. The steady-state error model 406 and the dynamic error model 408 may be used separately and/or in combination to implement the error model 108 of FIG. 1 and/or the error model 208 of FIG. 2.

For clarity, the following discussion of the example error model generator 400 will refer to the example error model generator 106 and the example error model 108 of FIG. 1. However, the following discussion is equally applicable to the example error model generator 206 and the example error model 208 of FIG. 2.

The example error model generator 400 receives input data 410 as discussed above with reference to FIGS. 1 and 2. The input data 410 may be, for example, data representative of actual inputs x to a process (e.g., the process system 102 as configured in FIG. 1), test outputs w from a process (e.g., the process system 102 as configured in FIG. 2), test outputs z from a first principle model (e.g., the first principle model 104 as configured in FIG. 2), and/or a difference y between test outputs of a process system and a first principle model (e.g., the output of the subtractor 110 as configured in FIG. 1).

Additionally or alternatively, the example error model generator 400 may receive input from the user interface 114. A system user, via the user interface 114, may provide functions 412 to the error model generator 400 to specify, for example, a mathematical format for the error model 108. In some examples, the error model generator 400 autonomously determines functions to be used. Additionally or alternatively, the system user, via the user interface 114, may provide constraints 414 to the error model generator 400 to constrain the search space of an optimization solution. The constraints 414 may bound the error model 108 output to comply with absolute and/or practical constraints, examples of which are provided below.

In the following operational description of the example error model generator 400, the term x may generally refer to an input such as a simulated input to a simulation block (e.g., the first principle model 104 of FIGS. 1 and 2) and/or a real input to a process (e.g., the actual process 102 of FIGS. 1 and 2). The term y may generally refer to a difference between an actual output and a corresponding model output (e.g., a modeling error, z-w as shown in FIGS. 1 and 2). The term ỹ may generally refer to an expected or simulated error determined by an error model, such as the error model 108 and 208 output(s) of FIGS. 1 and 2.

In operation, the error model generator 400 receives the input data 410, the functions 412, and/or the constraints 414 during a training phase. The steady-state error model generator 402 generates the steady-state error model 406 based on the received input data 410, the functions 412, and/or the constraints 414. The detailed operation of the example error model generator 400 will be discussed below with reference to the flowcharts 700 and 800 of FIGS. 7 and 8, respectively.

For steady-state model representation, an example objective may be to find a function $f(x,y,a)$ such that the calculated $\tilde{y}32\ f(x_i,y_i,a)$ closely fits the original $y_i$ based on one or more selected criteria. In the described example, models are considered better as the absolute value of $(\tilde{y}_i - y_i)$ decreases for a given i. An example function to describe the relationship between the input(s) x and the output error y can be expressed in the general form of Equation 1 below.

$$y = a_1 \cdot f_1(x) + a_2 \cdot f_2(x) + \ldots + a_n \cdot f_n(x) \qquad \text{Eq. 1}$$

In Equation 1, each example function $f_i(x)$ is an independent constant or formula, either linear or nonlinear, representing a steady-state relationship. Therefore, for an example data set $(x_i, y_i)$, example error model calculation equations can be expressed as shown below in Equations 2, 3, and 4.

$$\tilde{y}_1 = a_1 \cdot f_1(x_1) + a_2 \cdot f_2(x_1) + \ldots + a_n \cdot f_n(x_1) \quad \text{Eq. 2}$$

$$\tilde{y}_2 = a_1 \cdot f_1(x_2) + a_2 \cdot f_2(x_2) + \ldots + a_n \cdot f_n(x_2) \quad \text{Eq. 3}$$

...

$$\tilde{y}_m = a_1 \cdot f_1(x_m) + a_2 \cdot f_2(x_m) + \ldots + a_n \cdot f_n(x_m) \quad \text{Eq. 4}$$

The example parameter or coefficient set a (i.e., $[a_1, a_2, \ldots, a_n]$) can be solved by the steady-state error model generator 402 using constrained linear programming, constrained quadratic programming, and/or any other appropriate formulation or process. Additionally or alternatively, unconstrained least squares regression may be implemented by the steady-state error model generator 402 to determine the parameter set a.

In this particular example, the functions are defined by a system user (e.g., via the user interface 114) to be $f_1(x)=1$, $f_2(x)=x$, $f_3(x)=1/x$, and $f_4(x)=\ln(x)$, and therefore the output prediction equation may be expressed as shown below in Equation 5.

$$\tilde{y}_m = a_1 + a_2 \cdot x_m + a_3/x_m + a_4 \cdot \ln(x_m) \quad \text{Eq. 5}$$

Based on the system being modeled, any of the functions 412 $f_1, f_2, f_3$, and/or $f_4$ may be modified and/or functions may be added or removed from the set of functions 412.

The constraints 414 may also be received by the steady-state error model generator 402. As mentioned above, the constraints 414 may bound the error model 108 to comply with absolute and/or practical constraints. An example absolute constraint may be $\tilde{y}_i \leq 100\%$, where if $\tilde{y}$ is a relative amount of a substance that is removed from a volume of space. This constraint corresponds to the fact that a process cannot remove more than 100% of a substance from a space. An example practical constraint may be $\tilde{y}_i \geq x_i$ when the relative dollar costs of x and y make a process impractical to implement otherwise (e.g., due to diminished returns in removal of $\tilde{y}_i$ as $x_i$ approaches $\tilde{y}_i$).

Using a constrained linear programming approach, the error model generator 402 attempts to minimize the sum of the absolute values of the differences between an error in the first principle model 104 output (e.g., y) and an error $\tilde{y}$ predicted by the error model 108, as shown below in Equation 6.

$$\text{Minimize} \sum_{i=1}^{n} |\tilde{y}_i - y_i| \quad \text{Eq. 6}$$

It should be noted that Equation 6 may also be expressed as minimizing the sum of the absolute values of differences between the compensated first principle-based model output and the actual output w. Using a constrained quadratic programming approach, the steady-state error model generator 402 attempts to minimize the sum of the squares of the differences between the first principle model output (e.g., Equation 5) and the actual outputs, as shown below in Equation 7.

$$\text{Minimize} \sum_{i=1}^{n} (\tilde{y}_i - y_i)^2 \quad \text{Eq. 7}$$

Like Equation 6, Equation 7 may also be expressed as minimizing the sum of the squares of differences between the compensated first principle-based model output and the actual output w. If constraints are removed from the quadratic programming approach, the solution may be found using a least squares regression technique. However, in many applications, constrained optimization may generate more appropriate error models.

To evaluate Equation 6, the example steady-state error model generator 402 receives several independent test inputs (e.g., $x_i$, where $i=1$ to N) and corresponding dependent test process outputs (e.g., $w_i$, where $i=1$ to N) from the process system 102, and corresponding dependent simulation (e.g., $z_i$, where $i=1$ to N) inputs from the first principle model 104. In the illustrated example, the steady-state error model generator 402 determines or generates a model of the difference(s) between the test process output(s) w and simulation outputs z and generates the steady-state error model 406 based on the difference(s). Additionally or alternatively, the steady-state error model generator 402 determines a model of the error between w and z as a function $f(x)$ and generates the steady-state error model 406 based on the function $f(x)$. The example steady-state error model 406 may represent linear and/or non-linear steady-state relationships between modeling errors and process inputs.

In contrast to the steady-state error model generator 402, the example dynamic error model generator 404 generates a dynamic error model 408 that represents a linear error relationship. While a least squares method may be used to determine the dynamic error model 408, the least squares method can be sensitive to process noise and/or disturbances in input data. Additionally, if the error between the process system 102 and the first principle model 104 is autocorrelated and/or correlated to the input(s), which often occurs in practical applications, identified parameters may not converge to the correct values. Other methods, such as the instrumental variable method (and variations of the instrumental variable method) are designed to overcome most convergence problems of least squares methods. However, the instrumental variable methods may also suffer convergence problems when the error between the process system 102 and the first principle model 104 is autocorrelated. Most least squares and instrumental variable methods generally suffer from any one of more of several additional problems such as sensitivity to the degree of input excitation, sensitivity to process noise, sensitivity to un-modeled dynamics, failure to converge to the correct value, and/or failure to converge to any value.

Due to the relative advantages and limitations of the least squares and instrumental variable methods, the example dynamic model generator 404 uses a different optimization method to search for a set of model parameters, with the goal of reducing or minimizing prediction error. Example prediction equations at different times are expressed below in Equations 8, 9, and 10.

$$\tilde{y}(k) = -a_1 \cdot y(k-1) - a_2 \cdot y(k-2) - \ldots - a_n \cdot y(k-n) + b_1 \cdot x(k-1) + \ldots b_m \cdot x(k-m) \quad \text{Eq. 8;}$$

$$\tilde{y}(k+1) = -a_1 \cdot \tilde{y}(k) - a_2 \cdot y(k-1) - \ldots - a_n \cdot y(k-n+1) + b_m \cdot x(k) + \ldots b_m x(k-m+1) \quad \text{Eq. 9;}$$

...

$$\tilde{y}(k+N) = -a_1 \cdot \tilde{y}(k-1+N) - a_2 \cdot \tilde{y}(k-2+N) - a_2 \cdot \tilde{y}(k-2+N) - \ldots - a_n \cdot \tilde{y}(k-n+N) + b_1 \cdot x(k-1+N) + \ldots + b_m \cdot x(k-m+N) \quad \text{Eq. 10.}$$

The example prediction Equations 9 and 10 substitute predictions (i.e., expected errors) $\tilde{y}$ at previous times for observed errors y where the prediction equation $\tilde{y}(k+i)$ has already been defined. In other words, a given predicted $\tilde{y}(k+i)$ is used in place of measured values $y(k+i)$ for up to n prediction equations at subsequent times (e.g., $k+i+1$ to $k+i+n$). While there is a total of N+1 prediction equations, there are n terms in each prediction equation, where n<N. When a given predicted ỹ(k+i) has been used in n subsequent prediction equations, the predicted ỹ(k+i) is replaced by more recent prediction equations.

In some examples, the minimization function may be defined to be the sum of the error(s) between the predicted error ỹ and the measured or actual error y. To solve for the model parameters $[a_1, a_2, \ldots, a_n, b_1, b_2, \ldots, b_m]$, the optimization problem becomes a general non-linear optimization problem that does not have a closed analytical solution. The example dynamic error model generator 404 may identify an acceptable local minimum that provides an acceptable dynamic error model 408. The dynamic error model 408 may be selected to be immune, substantially immune, or resistant to high frequency noise caused by transients and/or unmodeled dynamics. The computational method for constrained optimization based on the prediction Equations 8-10 includes: 1) finding an initial condition $\theta_0$ for the model parameters $a_1 \ldots a_n$, and $b_1 \ldots b_m$; and 2) finding model parameters through constrained optimization utilizing the prediction equations based on the initial condition.

To find the initial condition $\theta_0$ for the model parameters, the dynamic error model generator 404 may apply a least squares approach. N prediction equations using the form of prediction Equations 11, 12, and 13, a set of N test inputs x, and a set of N test errors y (i.e., differences between test process output(s) w and test model outputs z), an initial set of model parameters $[a_1 \ldots a_n,$ and $b_1 \ldots b_m]$ may be generated.

$$\tilde{y}(k) = -a_1 \cdot y(k-1) - a_2 \cdot y(k-2) - \ldots - a_n \cdot y(k-n) + b_1 \cdot x(k-1) + \ldots b_m \cdot x(k-m) \qquad \text{Eq. 11}$$

$$\tilde{y}(k+1) = -a_1 \cdot y(k) - a_2 \cdot y(k-1) - \ldots - a_n \cdot y(k-n+1) + b_1 \cdot x(k) + \ldots b_m \cdot x(k-m+1) \qquad \text{Eq. 12}$$

$$\tilde{y}(k+N) = -a_1 \cdot y(k-1+N) - a_2 \cdot y(k-2+N) - \ldots - a_n \cdot y(k-n+N) + b_1 \cdot x(k-1+N) + \ldots + b_m \cdot x(k-m+N) \qquad \text{Eq. 13}$$

Equations 11-13 may be optimized using a least squares approach, which yields an optimization problem expressed below by Equation 14, and the express analytical solution $\theta_0$ to the initial condition is provided below in Equations 15, 16, 17, 18, and 19.

$$\text{Minimize} \sum_{i=1}^{N} (\tilde{y}(k+i) - y(k+i))^2 \qquad \text{Eq. 14}$$

$$\theta_0 = (\Phi^T \Phi)^{-1} \Phi^T Y \qquad \text{Eq. 15}$$

$$\text{wherein: } \theta = [a_1, a_2, \ldots, a_n, b_1, b_2, \ldots, b_m]^T \qquad \text{Eq. 16}$$

$$Y = [y(k+1), y(k+2), \ldots, y(k+N)]^T \qquad \text{Eq. 17}$$

$$\Phi = [\varphi_1, \varphi_2, \ldots, \varphi_N]^T \qquad \text{Eq. 18}$$

$$\varphi_k^T = [-y(k-1), -y(k-2), \ldots, -y(k-n), x(k-1), x(k-2), \ldots, x(k-m)] \qquad \text{Eq. 19}$$

In the above equations, k is an arbitrary time step, n is the order of the system, and the variable m is the number of previous inputs affecting a given output. The example dynamic error model generator 404 determines $\theta_0$ to minimize Equation 15 to determine the initial condition.

After determining the initial condition, the example dynamic error model generator 404 finds the model parameters through constrained optimization of Equation 15. In many industrial processes, the gain of the process is known to be in a certain range based on prior knowledge of the process and/or equipment components and/or based on previous experience with the process and/or equipment. Such knowledge about the process gain can be used to develop constraints for the constrained optimization. Based on the prediction Equations 11-13, the steady-state gain may be computed using Equation 20 as set forth below:

$$G_{ss} = \frac{b_1 + b_2 + \ldots + b_m}{1 + a_1 + a_2 + \ldots + a_n} \qquad \text{Eq. 20}$$

Based on the steady-state gain $G_{SS}$ shown in Equation 20, the solution to Equation 14 may be constrained according to Equation 21 below.

$$G_{ss\_L} \leq \frac{b_1 + b_2 + \ldots + b_m}{1 + a_1 + a_2 + \ldots + a_n} \leq G_{ss\_H} \qquad \text{Eq. 21}$$

In Equation 21, $G_{SS\_H}$ and $G_{SS\_L}$ are the high and low steady-state gain limits of the system, respectively. The example constraints $G_{SS\_H}$ and $G_{SS\_L}$ are linear constraints, and other linear constraints may be applied. However, non-linear constraints may also be used as illustrated below.

As mentioned above, system users may have prior knowledge of the system. Using such knowledge, the system users can create additional constraints defining the known range of output values based on input values. An example constraint is shown in Equation 22 below.

$$Y_L(i) \leq \tilde{y}(k+i) \leq Y_H(i) \qquad \text{Eq. 22}$$

In Equation 22, $Y_H(i)$ and $Y_L(i)$ are upper and lower bounds, respectively, for the output of the prediction equation at time (k+i). The example constraint Equation 22 is a non-linear constraint because the output of the prediction Equation 10 is not linearly dependent on time. In contrast, the constraint Equation 21 is a linear constraint because the gain is linearly dependent on the model parameters.

Additional or alternative techniques that may be used to generate the dynamic error model 408 may include generalized least squares regression, weighted least squares regression, repeated least squares regression, extended least squares regression, a subspace method, a maximum likelihood method, an instrumental variable method, an extended instrumental variable method, a frequency domain method, or a nonlinear optimization-based method.

FIGS. 5, 6, 7, and 8 illustrate flowcharts representative of example processes that may be used to implement the example first principle model 104, the example error model generators 106 and/or 206, the example error models 108 and/or 208, the example model components A-F, the example error model generator 400, the example steady-state error model generator 402, the example dynamic error model generator 404, and/or, more generally, the example compensated first principle-based simulation models 100 and 200 of FIGS. 1-4. These processes may be implemented as machine readable instructions comprising a program for execution by a processor such as the processor 912 shown in the example processor system 910 of FIG. 9. The program may be embodied in software stored on a tangible medium such as a CD-ROM, a floppy disk, a hard drive, a digital versatile disk (DVD), or a memory associated with the processor 912 and/or embodied in firmware or dedicated hardware in a well-known manner. For example, any or all of structures within the example first principle model 104, the example error model generators 106 and/or 206, the example error models 108 and/or 208, the example model components A-F, the example error model generator 400, the example steady-state error model generator 402, the example dynamic error model generator 404, and/or, more generally, the example compensated first principle-based simulation models 100 and 200 of FIGS. 1-4 could be implemented by software, hardware, and/or firmware. Further, although the example processes are described with reference to the flowcharts illustrated in FIGS. 5, 6, 7, and/or 8, persons of ordinary skill in the art will readily appreciate that many other methods of implementing the example first principle model 104, the example error model generators 106 and/or 206, the example error models 108 and/or 208, the example model components A-F, the example error model generator 400, the example steady-state error model generator 402, the example dynamic error model generator 404, and/or, more generally, the example compensated first principle-based simulation models 100 and 200 of FIGS. 1-4 may alternatively be used. For example, the order of execution of the blocks may be changed, and/or some of the blocks described may be changed, eliminated, or combined.

Figure 5:
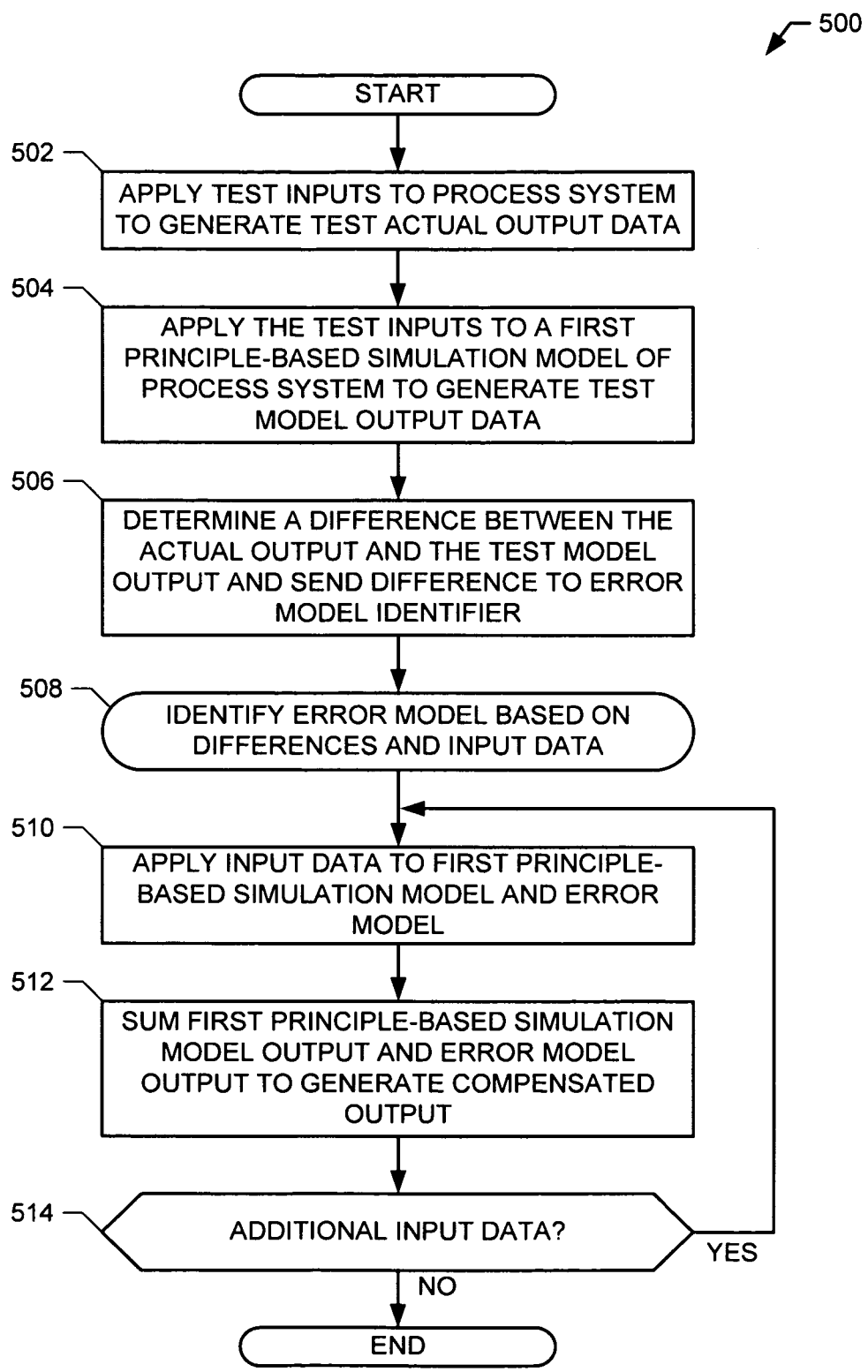
FIG. 5 is a flow diagram depicting an example process to compensate a first principle-based model using a parallel error model configuration.

FIG. 5 is a flow diagram depicting an example process 500 to compensate a first principle-based model using a parallel error model configuration. The example process 500 may be used to implement the training and/or operational phases for the example compensated first principle-based simulation model 100 of FIG. 1.

The example process 500 begins by applying one or more test inputs x to a process system (e.g., the process system 102 of FIG. 1) to generate test actual output data w (block 502). The process 500 also applies test inputs x to a first principle-based simulation model (e.g., the first principle model 104 of FIG. 1) representative of the process system 102 to generate test model output data z (block 504). The test input(s) x applied to the first principle model 104 may be mathematical representations of physical input(s) to the process system 102, and the test model output data z may be mathematical representations or mathematical estimations of the test actual output data w from the process system 102.

After applying the test inputs x and generating test actual output data w and test model output data z (blocks 502 and 504), the example process 500 determines a difference y between test actual output data and the test model output data (block 506). In the example of FIG. 1, block 506 may, for example, be performed by the subtractor 110. Based on the difference(s) determined by the subtractor 110 and on the test input data x, the example process 500 (e.g., via the error model generator 106) identifies an error model (e.g., the error model 108) (block 508). Block 508 is explained in further detail below in connection with FIG. 7.

The example process 500 then applies input data x to the first principle model 104 and applies the input data x to the error model 108 (block 510). The example process 500 (e.g., via the summer 112 of FIG. 1) sums the first principle model 104 output z and the error model 108 output ỹ to generate a compensated output (block 512). The example process 500 then determines whether there is additional input data x (block 514). If there is additional input data x (block 514), control may return to block 510 to apply the input data x to the first principle model 104 and the error model 108. If there is no additional input data x (block 514), the example process 500 may end. In this way, the example process 500 may be used to generate an error model to compensate a first principle-based model output.

Figure 6:
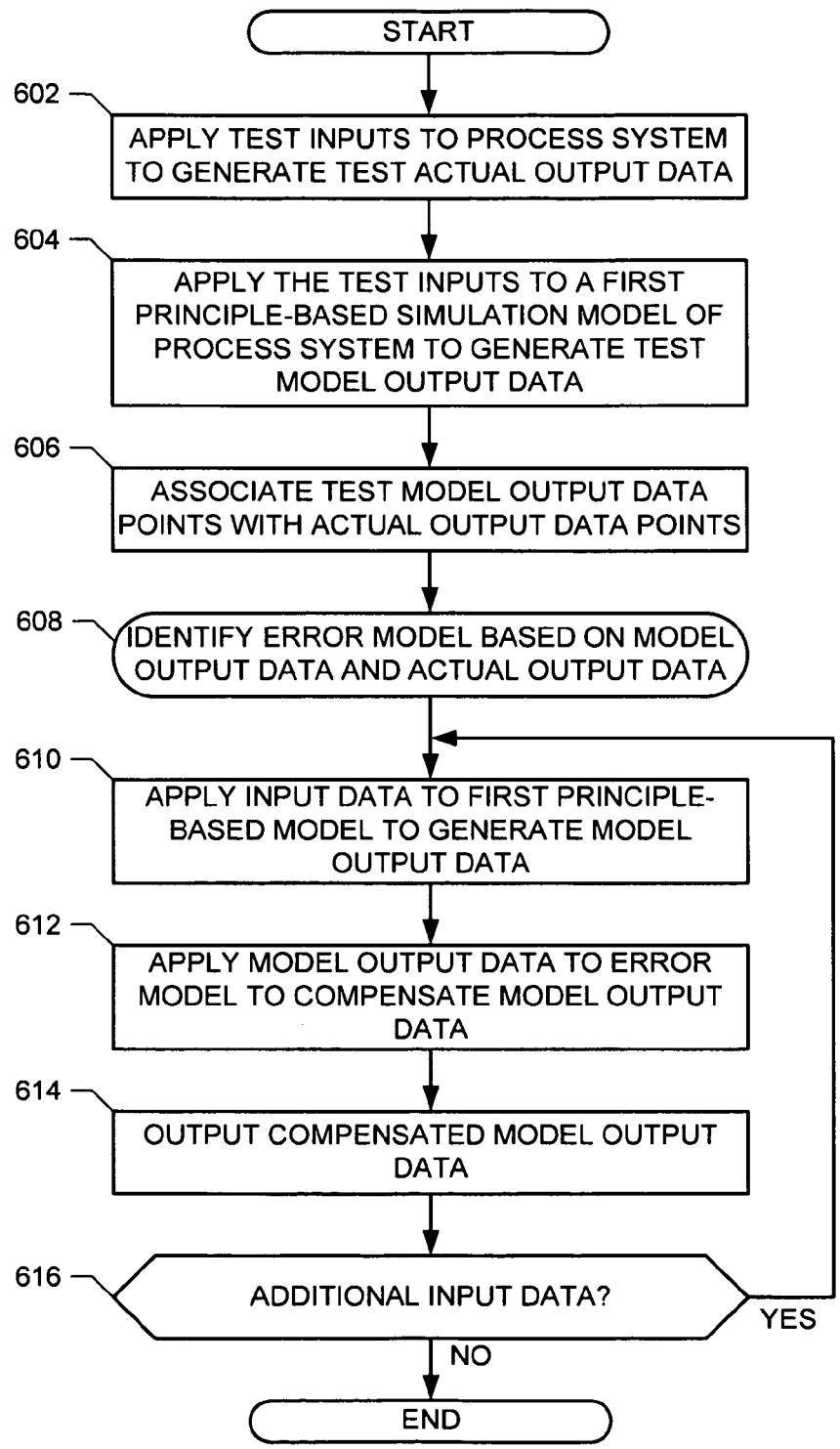
FIG. 6 is a flow diagram depicting an example process to compensate a first principle-based model using a cascade error model configuration.

FIG. 6 is a flow diagram depicting an example process 600 to compensate a first principle-based model using a cascade error model configuration. The example process 600 may be used to implement the training and operational phases of the first principle-based simulation model 200 illustrated in FIG. 2.

The example process 600 begins by applying test inputs x to a process system (e.g., the process system 102 illustrated in FIG. 2) to generate test actual output data w (block 602). The example process 600 further applies test inputs x to a first principle-based simulation model (e.g., the first principle model 104 of FIG. 2) to generate test model output data z (block 604). Based on the test actual output data w and test model output data w from blocks 602 and 604, the example process 600 associates the test model output data w with test actual output data z (e.g., via the error model generator 206 of FIG. 2) (block 606). For example, the error model generator 206 may associate a received test model output data point with a test actual output data point.

The example error model generator 206 then identifies an error model (e.g., the error model 208 of FIG. 2) based on the test model output data z and the test actual output data w (block 608). An example process 700 to implement block 608 is discussed in further detail below in connection with FIG. 7. The example process 600 applies input data x to the example first principle model 104 to generate model output data z (block 610). The model output data z is applied to the error model 208 to compensate the model output data (block 612). In some examples, the error model 208 is a linear transfer function. The error model 208 then outputs compensated model output data in response to receiving model output data (block 614).

The example process 600 then determines whether there is additional input data x (block 616). If there is additional input data x (block 616), control may return to block 610 to apply the input data x to the first principle model 104. If there is no additional input data x (block 616), the example process 600 may end.

Figure 7:
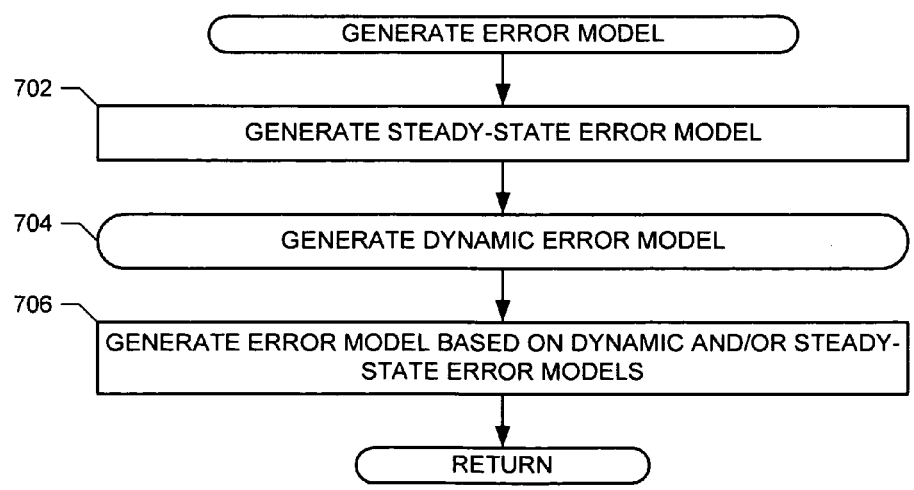
FIG. 7 is a flow diagram depicting an example process to generate an error model.

FIG. 7 is a flowchart depicting an example process 700 to identify an error model. The example process 700 may be implemented by the error model generator(s) 106, 206 and/or 400 of FIGS. 1, 2 and/or 4. The example process 700 begins by generating (e.g., via the steady-state error model generator 402 of FIG. 4) a steady-state model (e.g., the steady-state error model 406 of FIG. 4) (block 702). The example process 700 continues by generating (e.g., via the dynamic error model generator 404 of FIG. 4) a dynamic error model (e.g., the dynamic error model 408 of FIG. 4) (block 704). The example error model generator 106 then identifies an error model (e.g., the error model 108 and/or 208 of FIGS. 1 and 2) based on the steady-state 406 and/or dynamic error models 408 (block 706).

Figure 8:
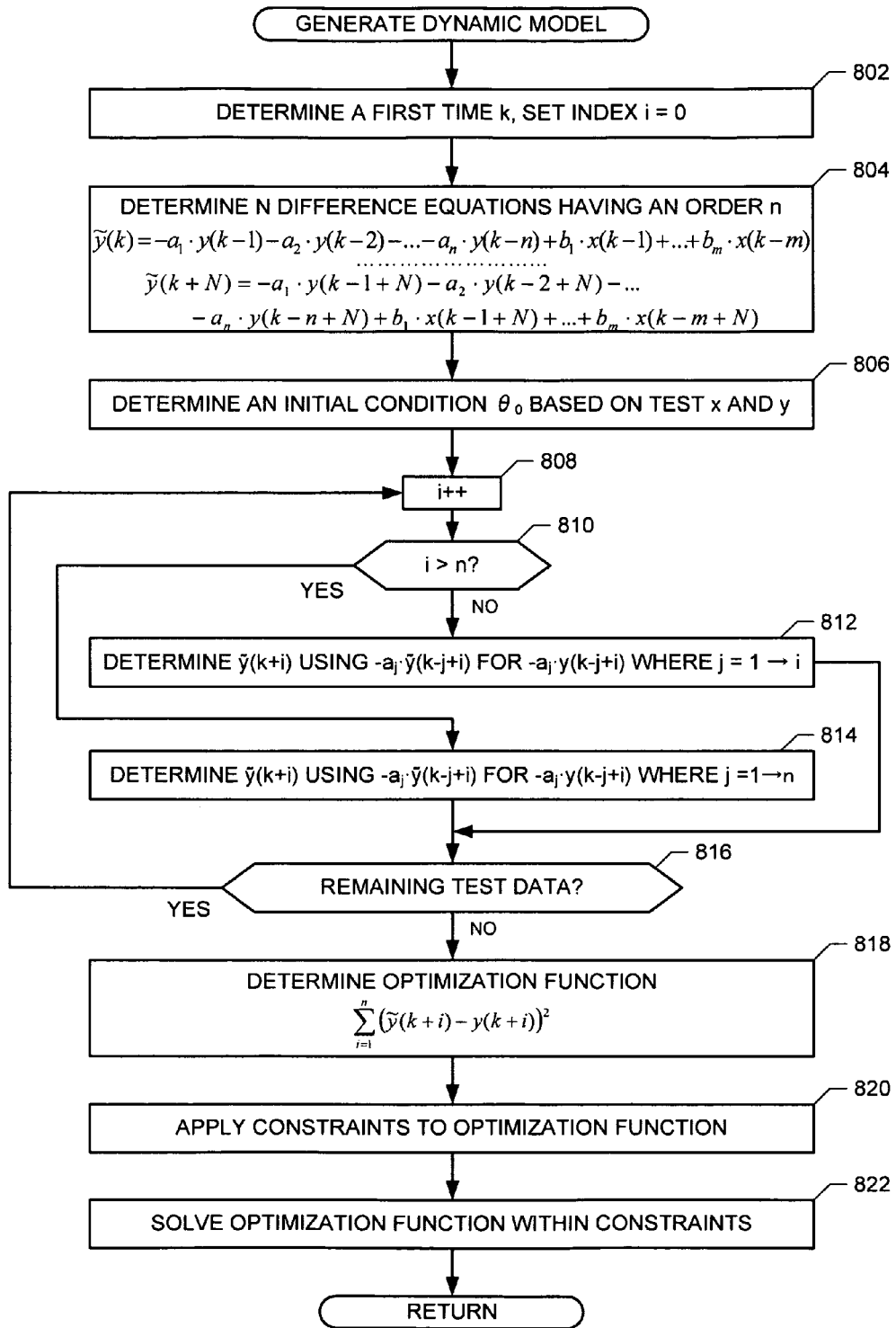
FIG. 8 is a flow diagram depicting an example process to generate a dynamic error model.

FIG. 8 is a flow diagram depicting an example process 800 to generate a dynamic error model. The example process 800 may be used to implement the example dynamic error model generator 404 and/or the example block 704 of FIG. 7.

The example dynamic error model generator 404 begins by determining a first time k and setting an index variable (e.g., i) to 0 (block 802). The dynamic error model generator 404 then determines difference or prediction equations using the time k and index i variables (block 804). Some example prediction equations (e.g., the Equations 11-13 above) are illustrated in FIG. 8, but other prediction or difference equations may be used. The example prediction Equations 11-13 have an order of n.

The dynamic error model generator 404 then determines an initial condition $\theta_0$ based on the Equations 11-13, the test inputs x, and the test process outputs w from a process system (e.g., the process system 102 of FIG. 1 or 2) (block 806). For example, the dynamic error model generator 404 may perform a least squares analysis on Equations 11-13 to determine an initial set $\theta_0$ of model parameters $[a_1, \ldots, a_n, b_1, \ldots, b_m]$. The dynamic error model generator 404 then increments i to increase the time variable of Equation 11 (block 808).

Next, the example process 800 modifies Equation 11 based on whether the time variable i is greater than the order of the equation. The dynamic error model generator 404 determines whether i is greater than n (i.e., the order of Equation 11) (block 810). If i is less or equal to n (block 810), the example dynamic error model generator 404 determines $\tilde{y}(k+i)$, where $-a_j \cdot \tilde{y}(k-j+i)$ is substituted for $-a_j \cdot y(k-j+i)$ for $j=1 \to i$ (block 812). For example, if i=1, the Equation 12 becomes Equation 9, where $-a_1 \cdot \tilde{y}(k)$ is substituted for $-a_1 \cdot y(k)$. In this manner, the initial condition at time i=k+0 is utilized to determine the expected output at the next time i=k+1.

If i is greater than n (block 810), the example dynamic error model generator 404 determines $\tilde{y}(k+i)$, where $-a_j \tilde{y}(k-j+i)$ is substituted for $-a_j \cdot y(k-j+i)$ for $j=1 \to n$ (block 814). Because the example difference or prediction equation only uses n terms, the example dynamic error model generator 404 substitutes the most recent terms into the prediction equation. After determining $\tilde{y}(k+i)$ (block 812 or 814), the dynamic error model generator 404 determines whether there is remaining test data (e.g., from the training phase described in FIGS. 1 and 2) (block 816). If there is additional test data (block 816), control returns to block 808 to increment the time variable i, and to either block 812 or 814 to determine $\tilde{y}(k+i)$.

When there is no remaining test data (block 816), the dynamic error model generator 404 determines an optimization function (e.g., Equation 14) (block 818). The optimization function is selected or determined to minimize error between a predicted output and an actual output. In the illustrated example, the predicted output is generated by a first principle model (e.g., the first principle model 104 of FIG. 1 or 2) and the actual output is generated by a process system (e.g., the process system 102 of FIG. 1 or 2). When the optimization function has been determined (block 818), the example dynamic error model generator 404 may apply constraints to the optimization function (block 820). The constraints may be supplied by a system user via a user interface (e.g., the user interface 114 illustrated in FIGS. 1, 2, and 4). Additionally, linear and/or non-linear constraints may be used. Example constraints for the optimization function of Equation 14 may include Equations 21 and 22.

The dynamic error model generator 404 then solves the optimization function (e.g., minimizes Equation 14) within any received constraints (block 822). The result of solving the optimization function is a set of model parameters $[a_1, \ldots, a_n, b_1, \ldots, b_m]$ that may be used in Equation 10 to compensate a first principle model during simulations of a modeled process system. The example process 800 then ends and returns to block 706 of the example process 700 of FIG. 7.

Figure 9:
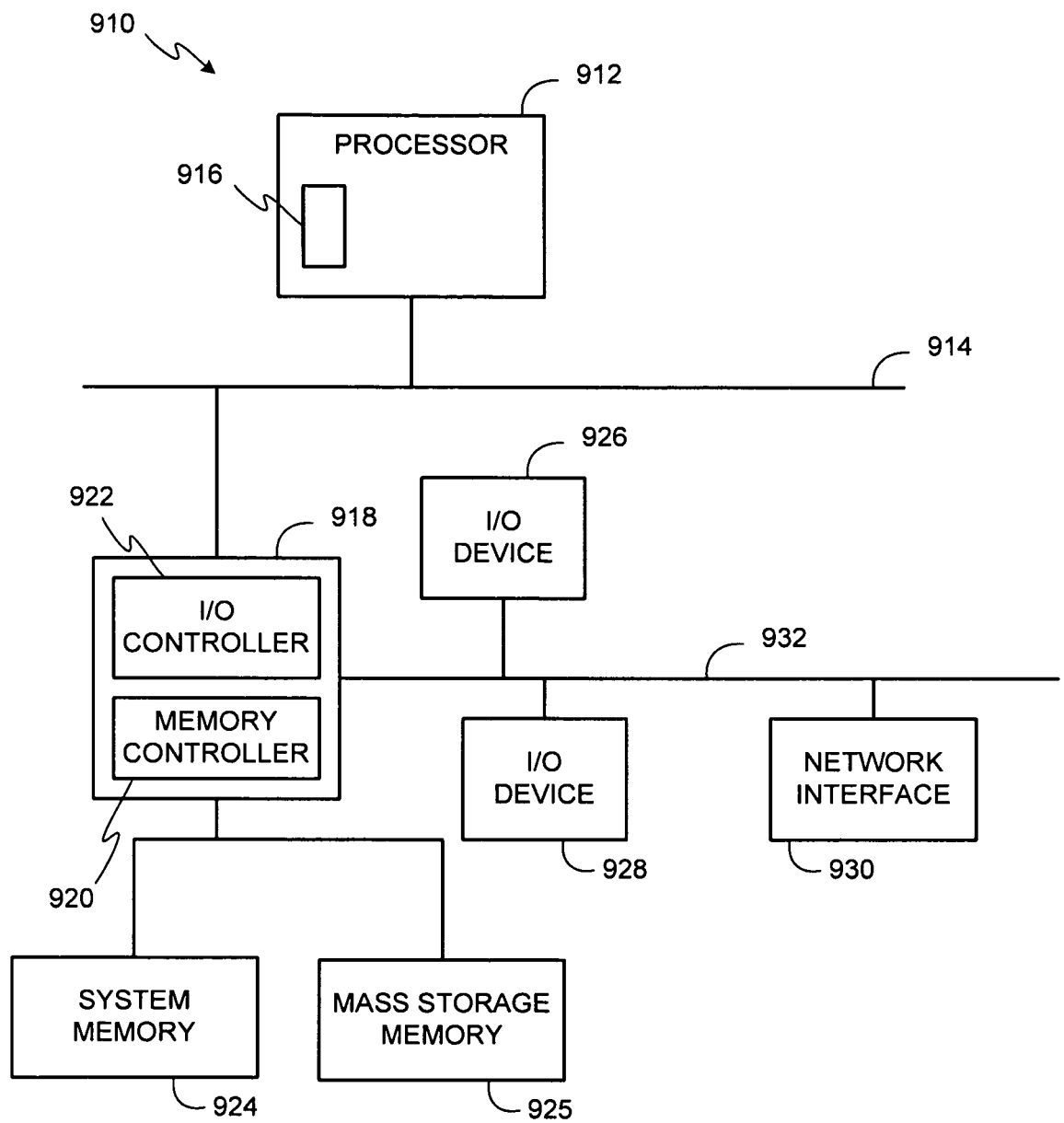
FIG. 9 is a block diagram of an example processor system that may be used to implement the example apparatus, methods, and articles of manufacture described herein.

FIG. 9 is a block diagram of an example processor system that may be used to implement the example apparatus, methods, and articles of manufacture described herein. As shown in FIG. 9, the processor system 910 includes the processor 912 that is coupled to an interconnection bus 914. The processor 912 includes a register set or register space 916, which is depicted in FIG. 9 as being entirely on-chip, but which could alternatively be located entirely or partially off-chip and directly coupled to the processor 912 via dedicated electrical connections and/or via the interconnection bus 914. The processor 912 may be any suitable processor, processing unit or microprocessor. Although not shown in FIG. 9, the system 910 may be a multi-processor system and, thus, may include one or more additional processors that are identical or similar to the processor 912 and that are communicatively coupled to the interconnection bus 914.

The processor 912 of FIG. 9 is coupled to a chipset 918, which includes a memory controller 920 and an input/output (I/O) controller 922. As is well known, a chipset typically provides I/O and memory management functions as well as a plurality of general purpose and/or special purpose registers, timers, etc. that are accessible or used by one or more processors coupled to the chipset 918. The memory controller 920 performs functions that enable the processor 912 (or processors if there are multiple processors) to access a system memory 924 and a mass storage memory 925.

The system memory 924 may include any desired type of volatile and/or non-volatile memory such as, for example, static random access memory (SRAM), dynamic random access memory (DRAM), flash memory, read-only memory (ROM), etc. The mass storage memory 925 may include any desired type of mass storage device including hard disk drives, optical drives, tape storage devices, etc.

The I/O controller 922 performs functions that enable the processor 912 to communicate with peripheral input/output (I/O) devices 926 and 928 and a network interface 930 via an I/O bus 932. The I/O devices 926 and 928 may be any desired type of I/O device such as, for example, a keyboard, a video display or monitor, a mouse, etc. The network interface 930 may be, for example, an Ethernet device, an asynchronous transfer mode (ATM) device, an 802.11 device, a DSL modem, a cable modem, a cellular modem, etc. that enables the processor system 910 to communicate with another processor system.

While the memory controller 920 and the I/O controller 922 are depicted in FIG. 9 as separate functional blocks within the chipset 918, the functions performed by these blocks may be integrated within a single semiconductor circuit or may be implemented using two or more separate integrated circuits.

Although certain methods, apparatus, and articles of manufacture have been described herein, the scope of coverage of this patent is not limited thereto. To the contrary, this patent covers all methods, apparatus, and articles of manufacture fairly falling within the scope of the appended claims either literally or under the doctrine of equivalents.

What is claimed is:

1. A method to compensate a first-principle based simulation model, comprising:
   applying one or more first test inputs to a process system to generate first output data;
   applying one or more second test inputs to a first principle model to generate second output data;
   determining a first prediction equation to express a relationship between the first test inputs and the first output data;
   determining an initial condition of the first prediction equation for one or more model parameters based on the first test inputs and the first output data;
   determining a second prediction equation for a first time based on at least one of a third prediction equation for a second time prior to the first time or the initial condition;
   generating an error model based on the first and second output data and based on at least one of the second or third prediction equations;
   applying model input data to the first principle model to generate simulation model output data; and
   compensating the simulation model output data via the error model to generate compensated model output data.

2. A method as defined in claim 1, wherein compensating the model data comprises generating error model output data and summing the simulation model output data and the error model output data.

3. A method as defined in claim 1, further comprising applying at least one of the first or second test inputs to the error model to train the error model to associate the at least one of the first or second test inputs with difference data.

4. A method as defined in claim 3, wherein at least one of the first or second test inputs applied to the error model corresponds to a difference between the first and second output data that is based on the at least one of the first or second test inputs.

5. A method as defined in claim 1, wherein generating the error model comprises applying one or more of a least squares regression, a generalized least squares regression, a weighted least squares regression, a repeated least squares regression, an extended least squares regression, a subspace method, a maximum likelihood method, an instrumental variable method, an extended instrumental variable method, a frequency domain method, or a nonlinear optimization-based method.

6. A method as defined in claim 1, wherein generating the error model comprises determining one or more model parameters.

7. A method as defined in claim 1, further comprising modifying the first principle model based on a change to the process system.

8. A method as defined in claim 1, wherein the first and second test inputs correspond to each other, and wherein the first and second output data correspond to respective ones of the first and second test inputs.

9. A method as defined in claim 1, wherein the generating the error model comprises generating at least one of a steady-state error model or a dynamic error model.

10. A method as defined in claim 1, wherein generating the error model comprises:
 determining an optimization function to optimize for a difference in the first and second output data in response to the first and second test inputs; and
 solving the optimization function within one or more constraints to determine the one or more model parameters for the error model based on at least one of the second prediction equation or the third prediction equation.

11. A method as defined in claim 10, wherein generating the error model further comprises applying the one or more constraints to the optimization function.

12. An apparatus to compensate a first principle-based model, comprising:
 a first principle model implemented in a memory to generate first output data based on one or more first inputs;
 an error model implemented in a memory to compensate the first output data during an operational phase to generate a compensated first principle-based model output based on the first output data; and
 an error model generator to:
  determine a first prediction equation to express a relationship between one or more process system inputs and one or more process system outputs;
  determine an initial condition of the first prediction equation for one or more model parameters based on one or more test inputs and one or more test outputs;
  determine a second prediction equation for a first time based on at least one of a third prediction equation for a second time prior to the first time or the initial condition; and
  generate the error model in the memory based on the first output data, based on process data during a training phase, and based on at least one of the second or third prediction equations, wherein the error model generator is to generate error model data received from a process system.

13. An apparatus as defined in claim 12, wherein the error model comprises at least one of a steady-state error model or a dynamic error model.

14. An apparatus as defined in claim 13, wherein the error model generator comprises at least one of a steady-state error model generator to generate the steady-state error model or a dynamic error model generator to generate the dynamic error model.

15. An apparatus as defined in claim 12, wherein the first principle model and the error model are configured in at least one of a cascade configuration or a parallel configuration.

16. An apparatus as defined in claim 15, wherein the parallel configuration further comprises a summer, wherein the error model generator is to generate the error model based on the one or more inputs, the first output data and second output data, and wherein the summer is to sum the first output data and error model output data to generate the compensated first principle-based model output.

17. An apparatus as defined in claim 15, wherein the error model is to receive the first output data in the cascade configuration and output the compensated first principle-based model output based on the first output data.

18. An apparatus as defined in claim 12, wherein the error model generator is to receive one or more of functions or constraints.

19. An apparatus as defined in claim 12, wherein the error model generator is to:
 determine an optimization function to optimize a difference between the first output data and the process system outputs in response to the test inputs; and
 solve the optimization function within one or more constraints to determine the model parameters for the error model based on at least one of the second prediction equation or the third prediction equation.

20. An apparatus as defined in claim 19, wherein the error model is further to apply the constraints to the optimization function.

21. A tangible computer-readable storage device or storage disc comprising instructions which, when executed by a computer, cause the computer to at least:
 apply one or more first test inputs to a process system to generate first output data;
 apply one or more second test inputs to a first principle model to generate second output data;
 determine a first prediction equation to express a relationship between one or more process system inputs and one or more process system outputs;
 determine an initial condition of the first prediction equation for one or more model parameters based on the first test inputs and the first output data;
 determine a second prediction equation for a first time based on at least one of a third prediction equation for a second time prior to the first time or the initial condition;
 generate an error model based on the first and second output data and based on at least one of the second or third prediction equations;
 apply model input data to the first principle model to generate simulation model output data; and
 compensate the simulation model output data via the error model to generate compensated model output data.

22. A computer-readable device or storage disc as defined in claim 21, wherein the instructions, when executed, cause the computer to compensate the simulation model output data by generating error model output data and summing the simulation model output data and the error model output data.

23. A computer-readable device or storage disc as defined in claim 21, wherein the instructions, when executed, cause the computer to apply at least one of the first or second test inputs to the error model to train the error model to associate the at least one of the first or second test inputs with difference data.

24. A computer-readable device or storage disc as defined in claim 23, wherein at least one of the first or second test inputs applied to the error model corresponds to a difference between the first and second output data that is based on the at least one of the first or second test inputs.

25. A computer-readable device or storage disc as defined in claim 21, wherein the instructions, when executed, cause the computer to generate the error model by generating at least one of a steady-state error model or a dynamic error model.

26. A computer-readable device or storage disc as defined in claim 21, wherein the instructions, when executed, cause the computer to generate the error model by applying one or more of a least squares regression, a generalized least squares regression, a weighted least squares regression, a repeated least squares regression, an extended least squares regression, a subspace method, a maximum likelihood method, an instrumental variable method, an extended instrumental variable method, a frequency domain method, or a nonlinear optimization-based method.

27. A computer-readable device or storage disc as defined in claim 21, wherein the instructions, when executed, cause the computer to generate the error model by determining one or more model parameters.

28. A computer-readable device or storage disc as defined in claim 21, wherein the instructions, when executed, cause the computer to modify the first principle model based on a change to the process system.

29. A computer-readable device or storage disc as defined in claim 21, wherein the first and second test inputs correspond to each other, and wherein the first and second output data correspond to respective ones of the first and second test inputs.

* * * * *

UNITED STATES PATENT AND TRADEMARK OFFICE
CERTIFICATE OF CORRECTION

| | |
|---|---|
| PATENT NO. | : 8,560,283 B2 |
| APPLICATION NO. | : 12/501262 |
| DATED | : October 15, 2013 |
| INVENTOR(S) | : Xu Cheng et al. |

It is certified that error appears in the above-identified patent and that said Letters Patent is hereby corrected as shown below:

On the title page item (75) the correct name of inventor "Richard Williams Kephart" is "Richard William Kephart, Jr."

Signed and Sealed this
Twenty-third Day of September, 2014

Michelle K. Lee
*Deputy Director of the United States Patent and Trademark Office*

UNITED STATES PATENT AND TRADEMARK OFFICE
CERTIFICATE OF CORRECTION

| | | |
|---|---|---|
| PATENT NO. | : 8,560,283 B2 | Page 1 of 1 |
| APPLICATION NO. | : 12/501262 | |
| DATED | : October 15, 2013 | |
| INVENTOR(S) | : Xu Cheng et al. | |

It is certified that error appears in the above-identified patent and that said Letters Patent is hereby corrected as shown below:

Title Page,
Item [75], Inventors, "Richard Williams Kephart, Jr." (as corrected to read in the Certificate of Correction issued September 23, 2014) is deleted and patent is returned to its original state with second inventor last name in patent to read with no suffix -- Richard Williams Kephart --.

Signed and Sealed this
Eleventh Day of November, 2014

Michelle K. Lee
*Deputy Director of the United States Patent and Trademark Office*